United States Patent [19]

Rosenberg

[11] Patent Number: 4,583,105
[45] Date of Patent: Apr. 15, 1986

[54] DOUBLE HETEROJUNCTION FET WITH OHMIC SEMICONDUCTOR GATE AND CONTROLLABLE LOW THRESHOLD VOLTAGE

[75] Inventor: James J. Rosenberg, Bronx, N.Y.

[73] Assignee: International Business Machines Corporation, Armonk, N.Y.

[21] Appl. No.: 454,741

[22] Filed: Dec. 30, 1982

[51] Int. Cl.[4] .................. H01L 29/78; H01L 29/205; H01L 29/80
[52] U.S. Cl. .............. 357/23.12; 357/23.15; 357/23.2; 357/16; 357/22
[58] Field of Search ............ 357/16, 22, 23.12, 23.15, 357/23.2

[56] References Cited

U.S. PATENT DOCUMENTS

| | | | |
|---|---|---|---|
| 3,673,471 | 6/1972 | Klein | 357/16 |
| 4,075,652 | 2/1978 | Umebachi et al. | 357/22 |
| 4,151,635 | 5/1979 | Kashkoli et al. | 29/571 |
| 4,424,525 | 1/1984 | Mimura | 357/16 |

FOREIGN PATENT DOCUMENTS 0055968  7/1982  European Pat. Off. .

OTHER PUBLICATIONS

T. Mimura et al, Japanese Journal of Applied Physics, vol. 19, No. 5, May 1980, pp. L225-L227, "A New Field-Effect Transistor with Selectively Doped GaAs/n-$Al_xGa_{1-x}As$ Heterojunctions".
Japanese Journal of Applied Physics, vol. 20, No. 4, Apr. 1981, pp. L245-L248, "Extremely High Mobility of Two-Dimensional Electron Gas in Selectively Doped GaAs/N-AlGaAs Heterojunction Structures Grown by MBE", by Hiyamizo et al.
Drummond et al, "A Novel Normally-Off Camel Diode Gate GaAs FET", Appld. Phys. Ltrs., vol. 40, No. 9, May 1982, pp. 834-836.
Maloney et al, "AlGaAs/GaAs JFETS by Organo-Mettallic and MBE", Electronics Ltrs., vol. 18, No. 3, Feb. 1982, pp. 112-113.
Chen et al, "Short Channel $Ga_{0.47}In_{0.53}As/Al_{0.48}In_{0.52}As$ Selectively Doped Field Effect Transistors", IEEE Elec. Devs. Ltrs., vol. EDL-3, No. 8, Aug. 1982, pp. 205-208.
Double Hetero. $Ga_{0.47}In_{0.53}As$ MESFET, by MBE, Ohno et al., IEEE Ele. Dev. Ltrs., vol. EDL-1, No. 8, Aug. 1980, pp. 154-155.

Primary Examiner—Martin H. Edlow
Assistant Examiner—Terri M. Henn
Attorney, Agent, or Firm—Thomas J. Kilgannon

[57] ABSTRACT

This invention relates to an improved heterojunction FET. More specifically the invention is directed to a heterojunction FET device in which the contact to the semiconductor gate is ohmic in character. The gate and channel regions of the FET have the same barrier height relative to an intervening third layer of semiconductor and sandwich the third layer of undoped semiconductor. The resulting symmetry of the structure provides a threshold voltage which lies normally near zero volts and is controllable upwardly or downwardly by adding an n or p type dopant to the undoped third layer or region.

48 Claims, 4 Drawing Figures

DOUBLE HETEROJUNCTION FET WITH OHMIC SEMICONDUCTOR GATE AND CONTROLLABLE LOW THRESHOLD VOLTAGE

DESCRIPTION

1. Technical Field

This invention relates to an improved heterojunction FET. More specifically the invention is directed to a heterojunction FET device in which the contact to the semiconductor gate is ohmic in character. The gate and channel regions of the FET have the same barrier height relative to an intervening third layer of semiconductor and sandwich the third layer of undoped semiconductor. The resulting symmetry of the structure provides a threshold voltage which lies normally near zero volts and is controllable upwardly or downwardly by adding an n or p type dopant to the undoped third layer or region.

2. Background of the Invention

Recent literature has shown that heterojunction field effect transistors operating at low temperature have achieved extremely fast switching times in under 10 picoseconds. These devices are characterized as High Electron Mobility Transistors (HEMT) and their high switching speed results from their high channel mobility at low temperature.

One such device was disclosed in the Japanese Journal of Applied Physics, Vol. 19, No. 5, May, 1980, pages L225–L227 in an article "A New Field-Effect Transistor With Selectively Doped GaAs/n—$Al_xGa_{1-x}As$ Heterojunctions" in the names of T. Mimura et al. The device described in the article consists of a pair of undoped gallium arsenide layers sandwiching a layer of silicon doped gallium aluminum arsenide. In the article, a rectifying contact for the gate is provided by the deposition of aluminum on the surface of the non-doped gallium arsenide of the top epi layer. This results in a device having a threshold voltage which is not as controllable or as low as it might be. Devices with controllable, low threshold voltages are essential for logic circuits with reduced power supply voltages. To the extent that a Schottky or rectifying contact to the gate is utilized, a threshold voltage which departs significantly from a desired threshold voltage near zero is obtained.

In another article in the Japanese Journal of Applied Physics, Vol. 20, No. 4, April, 1981, pages L245–L248 entitled "Extremely High Mobility of Two-Dimensional Electron Gas In Selectively Doped GaAs/N-AlGaAs Heterojunction Structures Grown by MBE" by Hiyamizo et al, there is shown a selectively doped heterojunction structure in which an undoped gallium aluminum arsenide layer was disposed on top of an undoped gallium arsenide layer. A silicon doped gallium aluminum arsenide layer was shown disposed over the undoped gallium aluminum arsenide layer and an ohmic contact was made by applying Au-Ge to the contact areas including the mesa edges where the GaAs/N-AlGaAs interface was exposed. This structure was used to investigate the accumulation of a two dimensional electron gas at the interface of the heterojunction. The same article shows an enhancement mode high electron mobility transistor (E-HEMT) which incorporated an undoped gallium arsenide layer; an undoped gallium aluminum arsenide layer and a silicon doped gallium aluminum arsenide layer. While ohmic contacts were applied to the source and drain, an aluminum Schottky gate was applied to the silicon doped gallium aluminum arsenide upper layer. This device exhibited a threshold voltage of zero at room temperature and 0.19 volts at 77° K. While this arrangement exhibits a threshold voltage which lies near zero, the device characteristics are not very controllable in that the thickness of the underlying layer is so small that penetration of the gate through the silicon doped gallium aluminum arsenide layer is likely to occur unless extreme care is taken during fabrication. More importantly, very stringent control of both layer thickness and doping level are required to obtain the desired threshold. Steps of this character should be avoided in production processes where high yields are required. In any event, while an ohmic contact to the silicon doped gallium aluminum arsenide layer is suggested, a Schottky contact rather than the ohmic contact is used in the HEMT device to form the gate of that device.

U.S. Pat. No. 4,151,635 issued May 1, 1979 in the names of Kashkooli et al entitled "Method for Making a Complementary Silicon Gate MOS Structure" shows a P-channel MOS device formed in a first region and an N-channel MOS device formed in a second region. Each of the P and N-channel devices has a polycrystalline gate structure in which the polycrystalline material is doped with a P-type impurity to make possible the matching of threshold voltages of both devices. The devices of this patent are well-known insulated gate field effect transistors as opposed to the double heterojunction structure of the present invention which does not incorporate an oxide barrier layer. Particular note should be taken of the fact that instead of doping of the polycrystalline gate structure with a P-type impurity, the present disclosure utilizes both N and P-type impurities introduced into a semiconductor barrier layer to adjust the threshold upwardly or downwardly from a threshold which is near zero as a result of the novel structure of the present invention.

U.S. Pat. No. 4,075,652 issued Feb. 21, 1978 in the name of Umebachi et al entitled "Junction Gate Type GaAs Field-Effect Transistor and Method of Forming" discloses a heterojunction type GaAs junction field-effect transistor of the type in which a channel region consists of an n-type gallium arsenide layer with a higher mobility and a gate region which consists of a p-type gallium aluminum arsenide layer which is grown heteroepitaxially. The gate, source and drain regions are self-aligned and the source and drain electrodes are formed of a metal such as aluminum. In this structure, a gate junction is provided by the p-n junction between the first and second layers and the conductivity in the first layer is controlled by the electric field in the second layer. A third layer of the same conductivity type as the second layer forms an extension of the second layer and an ohmic contact of aluminum is formed on the gate extension. The device of this patent differs from the device of the present application in that the device of the present application is a double heterojunction device wherein the conductivity type of the gate is the same conductivity type as that of the channel region. The thrust of the patent is to provide a third layer which is etched at a slower etching rate than the etching rate of the second layer to provide a second layer portion which is much narrower than the remaining portion of the third layer thereby providing a device with a gate length in the order of 1 micron. There is no hint or suggestion in this patent that a device with a threshold near zero may be obtained by providing gate and channel regions of the same conductivity type or that that threshold can be controlled by doping an undoped barrier layer.

In a related article entitled "A New Heterojunction Gate GaAs FET" by S. Umebachi et al in IEEE Transaction on Electron Devices, August 1975, page 613, a structure similar to that shown in the last cited patent is shown in which source, drain and gate contacts of gold-germanium eutectic are used. This resulted in a good ohmic contact to the p-GaAs gate where the impurity concentration was higher than $1 \times 10^{18}$ cm$^{-3}$. To the extent that the device of the cited article and its related patent are junction field effect transistors (JFET) they do not relate to the heterojunction structure of the present application. These references and particularly the last-cited article only stand for the fact that an ohmic contact may be made to a p-doped gallium arsenide layer.

It is, therefore, a principal object of the present invention to provide a heterojunction field effect transistor having a threshold which lies near zero volts.

Another object of the present invention is to provide a heterojunction field effect transistor in which the addition of dopants to the barrier layer adjacent the layer which contains the source, drain and channel regions controls the device threshold to make it more positive or negative depending on the conductivity type of the dopant.

Still another object is to provide a heterojunction field effect transistor which utilizes a semiconductor gate to which an ohmic contact can be made.

Still another object is to provide a heterojunction field effect transistor wherein the conduction or valence band edge of the layer containing the source, drain and channel regions adjacent the heterojunction with an overlying barrier element is brought near the fermi level.

Still another object is to provide a heterojunction field effect transistor in which the layer containing the source, drain and channel regions and the semiconductor gate layer, both relative to the barrier element, have substantially the same barrier height.

Yet another object is to provide a heterojunction field effect transistor which is essentially non-conductive with zero voltage on its gate (enhancement mode device) and which can be made conductive with zero voltage on its gate (depletion mode device) by controlled doping of the barrier layer.

BRIEF SUMMARY OF THE INVENTION

The present invention relates to a double heterojunction field transistor which utilizes a substrate on which a first layer of single crystal semiconductor material such as gallium arsenide or germanium is epitaxially deposited. It also utilizes a barrier element of single crystal semiconductor material such as gallium aluminum arsenide which forms a heterojunction with the first layer. The band energy difference between the latter and the barrier element has a given barrier height. Means disposed on the barrier element for controlling at least the band edge of the first layer adjacent the heterojunction so it lies near the fermi level is also provided. The means has the same potential as the source and, relative to the barrier element, has a barrier height equal to the given barrier height. The means for controlling includes a single crystal semiconductor gate of a III-V compound such as gallium arsenide to which an ohmic contact can be made as a result of its heavy n-conductivity type doping.

Further, by appropriately doping the barrier element, it is possible to adjust the normally near-zero threshold to threshold values above or below zero.

The resulting device has a semiconductor gate to which an ohmic contact such as gold-germanium can be made as opposed to the prior art which uses a metal gate in the form of a Schottky barrier contact to an extension of a doped layer which overlies the channel region. The double heterojunction transistor device of the present invention is an enhancement mode device which, in the absence of any doping in its barrier layer, has a threshold voltage which normally lies near zero.

As indicated above, the threshold can be adjusted to suit requirements where higher enhancement mode thresholds are required or for the normally conducting operation if the depletion mode is required. Thus, the means for controlling the band edge adjacent the heterojunction between the first layer and the barrier element so that it lies near the fermi level differs from similar means used in the prior art in that the prior art utilizes a doped barrier element and a Schottky barrier connected to that element by means of an extension of the doped barrier element. The device of the present application requires no doping of its barrier element and further utilizes heavy doping of its semiconductor gate which is totally non-critical. In addition, an ohmic contact can be easily made to the highly doped gate layer.

While emphasis has been placed on n-channel devices in the foregoing, it should be appreciated that p-channel devices wherein the gate layer and the source and drain regions are of p-conductivity type can be made by selecting appropriate materials as will be shown hereinafter. In such devices, the valence band edge rather than the conduction band edge is adjusted so it lies near the fermi level. Also, the barrier heights of the gate layer and the first layer relative to the barrier element are substantially the same.

These and other objects, features and advantages of the present application will be apparent from the following more particular description of a preferred embodiment.

BRIEF DESCRIPTION OF THE DRAWINGS

FIG. 2.1 is a band energy diagram of the device of FIG. 1 showing that the conduction band edge (Ec) of a first layer adjacent a heterojunction formed between a first layer and a barrier element lies near the fermi level (Ef) when the barrier element is undoped.

FIG. 2.2 is a band energy diagram similar to that shown in FIG. 2.1 except that the barrier element is doped with an n-conductivity type dopant causing the threshold voltage ($V_T$) to be more negative.

FIG. 2.3 shows a band energy diagram similar to that shown in FIG. 2.1 except that the barrier element is doped with a p-conductivity type dopant causing the threshold ($V_T$) of the device of FIG. 1 to be more positive.

DESCRIPTION OF THE PREFERRED EMBODIMENTS

Figure 1:
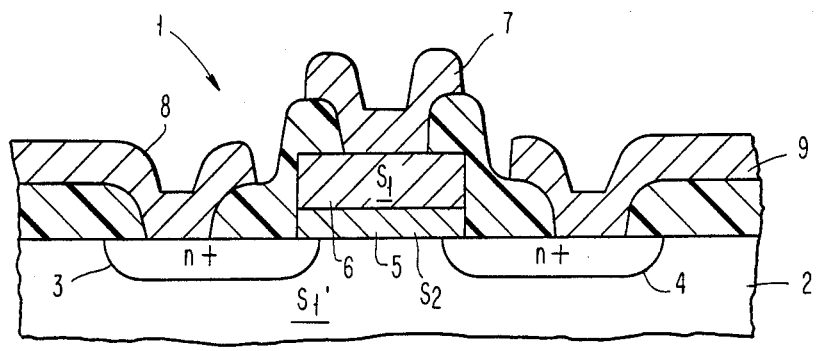
FIG. 1 is a partial cross-sectional view of a double heterojunction, n-channel field effect transistor which utilizes a semiconductor gate having an ohmic contact thereto. The threshold voltage of this device normally lies near zero and has high channel mobility at low temperature (77° K.).
Figure 1:
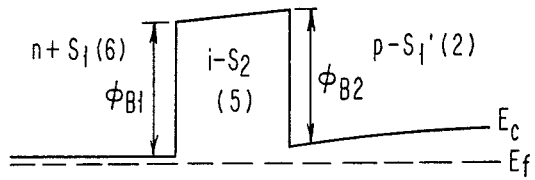
Figure 1:
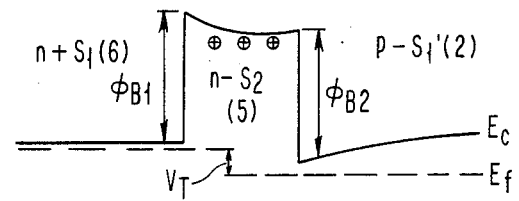
Figure 1:
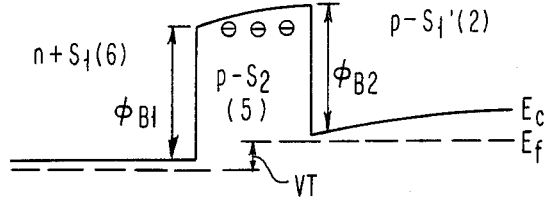

Referring now to FIG. 1 there is shown therein a cross-sectional view of an n-channel double heterojunction field effect transistor in accordance with the teaching of present invention. In FIG. 1, heterojunction field effect transistor 1 comprises a layer 2 of undoped gallium arsenide, for example. As a result of background doping during growth, layer 2 may be lightly doped with a p-conductivity type dopant without deleterious effect. Layer 2 is a single crystal layer of gallium arsenide which has been epitaxially grown on a layer of semi-insulating gallium arsenide (not shown) or other suitable substrate. Source and drain regions 3, 4, respectively, are shown disposed in layer 2. Regions 3, 4 are doped with an n-conductivity type dopant such as silicon, by ion implantation, for example. A channel region of n- conductivity type is, of course, formed between regions 3, 4 when the appropriate potentials are applied to device 1. Layer 2 is otherwise identified in FIG. 1 as S1'.

In FIG. 1, a barrier element 5 of undoped gallium aluminum arsenide, for example, is shown overlying the channel region between source region 3 and drain region 4. Barrier element 5 is formed from an epitaxially deposited layer of gallium aluminum arsenide by Molecular Beam Epitaxy (MBE) for example, in a manner well-known to those skilled in the semiconductor art.

In FIG. 1, a gate layer 6 is shown disposed over barrier element 5. Gate layer 6 is a single crystal layer of gallium arsenide, for example, heavily doped ($2\times10^{18}$ cm$^{-3}$) with an n-conductivity type dopant, such as silicon, which is deposited by MBE in a manner well-known to those skilled in the semiconductor art. Atop gate 6 is a contact 7 of a metal such as gold-germanium which forms an ohmic contact with gate layer 6.

Finally, in FIG. 1, metal contacts 8, 9 are shown contacting source region 3 and drain region 4, respectively. Contacts 8, 9 form ohmic contacts with regions 3, 4, respectively, and may be made of alloyed gold-germanium, for example.

Barrier element 5 and gate layer 6 are otherwise identified in FIG. 1 as layers S2 and S1, respectively. In FIG. 1, it should be noted that layer 2 and gate layer 6 are made of the same material and that the dopant of gate layer 6 is the same as the type of carriers supplied to the channel region in layer 2. Because gate layer 6 and layer 2 are of the same material, the barrier heights of these layers relative to the barrier element are equal. It should be appreciated that the materials of layers 2, 6 need not be the same. Layer 6 may be made of germanium, for example, doped with an n-conductivity type dopant such as arsenic or antimony.

Referring now to FIG. 2.1, there is shown a band energy diagram of device 1 of FIG. 1. The reference numbers and characters utilized in FIG. 1 identify the same elements where they are utilized in FIGS. 2.1–2.3.

When two semiconductors, S1 and S2, have different electron affinities, $\chi 1$ and $\chi 2$ such that $\chi 1 > \chi 2$ and a heterojunction is formed between the two semiconductors, a conduction band edge discontinuity or barrier height $\phi B = q\chi 1 - q\chi 2$ occurs at the heterojunction interface. In the double heterojunction structure of FIG. 1 which is comprised of an element 5 of undoped semiconductor S2 sandwiched between a gate layer 6 of semiconductor S1 and an underlying layer 2 of semiconductor S1', S1 and S1' have the same electron affinity $\chi 1$ and $\chi 1 > \chi 2$. FIG. 2.1 shows the energy band diagram of such a structure wherein Ec is the conduction band edge and Ef is the fermi level. Relative to barrier element 5 (S2), the barrier height ($\phi B1$) of gate layer 6 (S1) and the barrier height ($\phi B2$) of layer 2 (S1') are substantially the same. It should be noted that S1 and S1' may be, but need not necessarily be, of the same material. If S1 (layer 6) is very heavily doped as indicated by the designation n+ in FIG. 2.1 and S1' (layer 2) is lightly doped as indicated by the designation p- and their barrier heights are substantially the same, the conduction band edge, Ec will lie close to the fermi level, Ef, in S1' (layer 2) near the S1'/S2 interface when zero voltage bias is applied between gate layer 6 and layer 2. In other words, the threshold voltage for the formation of a conducting channel at the S1'/S2 interface is nearly zero volts. A controllable, near-zero threshold is desirable for field effect transistors which are to be used in low power, high speed logic. The controllability and reproducibility of a near-zero threshold obtainable by using ohmic contact 7 to a heavily doped semiconductor layer 6 of the present application contrasts with the difficulty in obtaining a near-zero threshold in Schottky barrier gated structures of the prior art which require tight control of both layer thickness and doping to achieve a similar near-zero threshold. To the extent that the prior art shows double heterojunction structures which utilize Schottky barrier gates, it appears that the benefits realized in using the semiconductor gate approach of the present application have not been recognized by the prior art.

Referring now to FIGS. 2.2 and 2.3, there are shown band energy diagrams similar to that shown in FIG. 2.1 except that in FIG. 2.2 the semiconductor S2 (layer 5) has been doped with an n-conductivity type dopant, and in FIG. 2.3, the S2 semiconductor (layer 5) has been doped with a p-conductivity type dopant. The addition of dopants to layer 5 alters the threshold voltage of device 1 of FIG. 1. In general, if barrier layer 5 is sufficiently thin, it will be completely depleted of carriers and, therefore, be nonconductive. However, if dopants are added to layer 5 such that a narrow, 50–250Å region adjacent to layer 2 is left undoped, the addition of dopants to layer 5 will not adversely affect the channel electron mobility. In particular, the addition of an n-conductivity type dopant to layer 5 shifts the threshold of device 1 such that a more negative gate voltage is required to bring device 1 to threshold as shown in FIG. 2.2. Similarly, the addition of a p-conductivity typedopant to layer 5 shifts the threshold so that a more positive gate voltage is required to bring device 1 to threshold as shown in FIG. 2.3.

While the foregoing exposition has focused on n-channel field effect transistors, it should be appreciated that p-channel field effect transistors would have the same basic structure as that shown in FIG. 1, except that: layer 2 would be undoped or possess a slight n-conductivity type background doping, regions 3, 4 would be p-conductivity type; layer 6 would be heavily doped with a p-conductivity type dopant and ohmic contacts 7, 8, 9 would be appropriate for the material to which a contact is made. With respect to the materials involved in a p-channel device, layer 2 may be germanium, element 5 undoped zinc selenide, layer 6 is germanium doped with arsenic or antimony, regions 3, 4 gallium doped and ohmic contacts 7, 8, 9 indium or tin.

In another n-channel embodiment, layer 2 is germanium, element 5 is gallium aluminum arsenide, layer 6 is germanium doped with arsenic or antimony, regions 3, 4 are doped with arsenic or antimony and contacts 7, 8, 9 are made of indium or tin.

In another p-channel embodiment, layer 2 is germanium, element 5 is gallium aluminum arsenide, layer 6 is germanium doped with gallium, regions 3, 4 are doped with gallium and contacts 7, 8, 9 are made of indium or tin.

In still another n-channel embodiment, layer 2 is indium arsenide, element 5 is zinc telluride doped with selenium or tellurium, layer 6 is indium arsenide, regions 3, 4 are doped with selenium or tellurium and contacts 7, 8, 9 are made of gold.

All of the above embodiments have voltage thresholds which normally lie near zero volts when their elements 5 are undoped. However, by introducing p or n type dopants into each element 5, the voltage thresholds may be adjusted to be more positive or more negative.

While FIGS. 2.1-2.3 show the conduction band edge (Ec) for n-channel device with undoped and doped barrier elements, it should be appreciated that the valence band edge (Ev) would exhibit a similar characteristic except that it would be a mirror image of the conduction band edge (Ec) lying beneath the fermi level (Ef) and where n-conductivity and p-conductivity types are shown p-conductivity and n-conductivity type, respectively, should be substituted. For p-channel devices, like n-channel devices, the barrier heights, $\phi B1$ and $\phi B2$, are equal.

Device 1 of FIG. 1 may be fabricated using the following steps many of which are well-known to those skilled in the semiconductor fabrication arts.

Layers 2, 5 and 6 may be grown by Molecular Beam Epitaxy (MBE). Layers 2 and 6 are of gallium arsenide, GaAs, while layer 5 is of gallium aluminum arsenide, $Al_xGa_{1-x}As$, where $X=0.3$. Layers 2, 5 and 6 may be grown on a substrate such as semi-insulating gallium arsenide or other suitable substrate. During deposition, upper gallium arsenide layer 6 is heavily doped ($>2\times10^{18}cm^{-3}$) with an n-conductivity type dopant such as silicon. Layer 6 should be doped as heavily as possible and have a thickness such that band bending from the ohmic contact does not penetrate to the heterojunction between gate 6 and element 5. Also, if the ohmic contact is alloyed to gate 6, the thickness of gate 6 should be greater than the alloying depth.

In a subsequent step, a portion of upper gallium arsenide layer 6 is selectively etched using well-known photolithographic and etching techniques to remove gallium arsenide everywhere except under a masked portion. A selective etch like $NH_4OH:H_2O_2$ selectively etches the gallium arsenide.

Using another selective etch like HF, layer 5 of gallium aluminum arsenide is etched selectively. The two etching steps form a self-aligned semiconductor gate 6 and barrier element 5 disposed over what will become the channel region of device 1 of FIG. 1.

Using gate layer 6 and barrier element 5 as a mask along with other appropriate masking by photoresist, for example, source and drain regions 3, 4, respectively, are ion implanted with an n-conductivity type dopant such as silicon. Source and drain regions 3, 4, respectively, have a doping level of $\geq 10^{18}cm^{-3}$.

Layer 5, in general should be thick enough to prevent excessive current flow between gate layer 6 and layer 2 but should be thin enough to maintain acceptably high transconductance. A minimum thickness is 200Å while a preferred thickness range of 200Å–500Å may be used.

After ion implanting, an insulation layer of silicon dioxide, for example, is deposited on the exposed surfaces by a well-known chemical vapor deposition technique. Contact holes for ohmic contacts to source, gate and drain regions 3, 6, 4, respectively, are formed using well-known photolithographic and etching techniques.

In a final step, ohmic contacts are formed on source, drain and gate regions 3, 6, 4 respectively, by depositing a metal such as gold-germanium which forms an alloyed ohmic contact with each of these regions. After deposition of the metal, the contacts are defined by well-known photolithographic masking and etching techniques and alloyed. A structure similar to that shown in FIG. 1 is provided.

If it is desired to adjust the threshold of the device of FIG. 1, an appropriate p or n-conductivity type dopant such as magnesium or beryllium and silicon respectively, may be introduced into barrier element 5 during deposition by MBE such that a portion of element 5 near the heterojunction with layer 2 is undoped while the portion of element 5 near the heterojunction with gate layer 6 is doped to a level of $10^{18}cm^{-3}$. Thus, where element 5 is 400Å thick, only the upper 200Å of element 5 is doped. The resulting threshold voltage, $V_T$, is about $\pm 0.4V$.

In operation, for a device 1 having a layer 2, of undoped gallium arsenide, an element 5 of undoped gallium aluminum arsenide having a thickness of 500Å, a layer 7 of heavily doped n-conductivity type gallium arsenide, the drain supply voltage, $V_{DD}$, should be $\leq 1$ Volt and the control voltage on the gate should also be $\leq 1$ V.

The device of FIG. 1 preferably operates at 77° K. to achieve the resulting high channel mobility.

Having thus described my invention, what I claim as new, and desire to secure by Letters Patent is:

1. A double heterojunction field effect transistor comprising:
   a first layer of a first single crystal semiconductor material having spaced apart source and drain regions of one conductivity type disposed therein defining a channel region therebetween,
   a barrier element of a second single crystal semiconductor material different from said first semiconductor material disposed on said first layer over said channel region and forming a heterojunction with said first layer, the band energy difference between said first layer and said barrier element providing a given barrier height and,
   means having the same potential as said source disposed on said barrier element for controlling at least a band edge of said first layer adjacent said heterojunction so it lies near the fermi level said means relative to said barrier element having a barrier height substantially equal to said given barrier height.

2. A double heterojunction field effect transistor according to claim 1 further including an ohmic contact connected to said means for controlling.

3. A double heterojunction field effect transistor according to claim 1 wherein said means for controlling at least the band edge of said first layer is a layer of single crystal semiconductor material heavily doped with a dopant of said one conductivity type.

4. A double heterojunction field effect transistor according to claim 1 wherein said means for controlling at least the band edge of said first layer is a layer of said first single crystal semiconductor material heavily doped with a dopant of said one conductivity type.

5. A double heterojunction field effect transistor according to claim 1 wherein said first semiconductor material is undoped and said regions of one conductivity type are n-conductivity type regions.

6. A double heterojunction field effect transistor according to claim 1 wherein said first semiconductor material is lightly doped with a p-conductivity type dopant and said regions of one conductivity type are n-conductivity type regions.

7. A double heterojunction field effect transistor according to claim 1 wherein said first semiconductor material is undoped and said regions of one conductivity type are p-conductivity type regions.

8. A double heterojunction field effect transistor according to claim 1 wherein at least a portion of said barrier element is made of doped single crystal semiconductor material.

9. A double heterojunction field effect transistor according to claim 1 wherein at least a portion of said barrier element is doped with a dopant of said one conductivity type.

10. A double heterojunction field effect transistor according to claim 1 wherein at least a portion of said barrier element is doped with a dopant of opposite conductivity type to said one conductivity type.

11. A double heterojunction field effect transistor according to claim 1 wherein said first single crystal semiconductor material is gallium arsenide and said spaced apart source and drain regions are of n-conductivity type, said second semiconductor material different from said first semiconductor material is gallium aluminum arsenide and said means for controlling is a gate layer of gallium arsenide heavily doped with silicon.

12. A double heterojunction field effect transistor according to claim 1 wherein said first single crystal semiconductor material is germanium and said spaced apart source and drain regions are of p-conductivity type doped with gallium, said second semiconductor material different from said first semiconductor material is zinc selenide and said means for controlling is a gate layer of germanium heavily doped with gallium.

13. A double heterojunction field effect transistor according to claim 1 wherein said first single crystal semiconductor material is germanium and said spaced apart source and drain regions are of n-conductivity type doped with arsenic or antimony, said second semiconductor material different from said first semiconductor material is gallium aluminum arsenide and said means for controlling is a gate layer of germanium heavily doped with arsenic or antimony.

14. A double heterojunction field effect transistor according to claim 1 wherein said first single crystal semiconductor material is germanium and said spaced apart source and drain regions are of p-conductivity type doped with gallium, said second semiconductor material different from said first semiconductor material is gallium aluminum arsenide and said means for controlling is a gate layer of germanium heavily doped with gallium.

15. A double heterojunction field effect transistor according to claim 1 wherein said first single crystal semiconductor material is indium arsenide and said spaced apart source and drain regions are of n-conductivity type doped with selenium or tellurium, said second semiconductor material different from said first semiconductor material is zinc telluride and said means for controlling is a gate layer of indium arsenide heavily doped with selenium or tellurium.

16. A double heterojunction field effect transistor according to claim 11 further including an ohmic contact of gold-germanium.

17. A double heterojunction field effect transistor according to claim 12 further including an ohmic contact of indium or tin.

18. A double heterojunction field effect transistor according to claim 13 further including an ohmic contact of indium or tin.

19. A double heterojunction field effect transistor according to claim 14 further including an ohmic contact of indium or tin.

20. A double heterojunction field effect transistor according to claim 15 further including an ohmic contact of gold.

21. A double heterojunction field effect transistor comprising:
a first layer of single crystal semiconductor material having spaced apart source and drain regions of one conductivity type disposed therein defining a channel region therebetween,
a barrier element of a second crystal semiconductor material different from said first semiconductor material disposed on said first layer over said channel region and forming a heterojunction with said first layer, the band energy difference between said first layer and said barrier element providing a given barrier height, and,
means having the same potential as said source disposed on said barrier element for controlling at least the conduction band edge of said first layer adjacent said heterojunction so it lies near the fermi level, said means relative to said barrier element having a barrier height substantially equal to said given barrier height.

22. A double heterojunction field effect transistor according to claim 21 further including an ohmic contact connected to said means for controlling.

23. A double heterojunction field effect trasistor according to claim 21 wherein said means for controlling at least the conduction band edge of said first layer is a layer of single crystal semiconductor material heavily doped with a dopant of said one conductivity type.

24. A double heterojunction field effect transistor according to claim 21 wherein said means for controlling at least the conduction band edge of said first layer is a layer of said first single crystal semiconductor material heavily doped with a dopant of said one conductivity type.

25. A double heterojunction field effect transistor according to claim 21 wherein said first semiconductor material is undoped and said regions of one conductivity type are n-conductivity type.

26. A double heterojunction field effect transistor according to claim 21 wherein said first semiconductor material is lightly doped with a p-conductivity type dopant and said regions of one conductivity type are n-conductivity type regions.

27. A double heterojunction field effect transistor according to claim 21 wherein at least a portion of said barrier element is made of doped single crystal semiconductor material.

28. A double heterojunction field effect transistor according to claim 21 wherein at least a portion of said barrier element is doped with a dopant of said one conductivity type.

29. A double heterojunction field effect transistor according to claim 21 wherein at least a portion of said barrier element is doped with a dopant of opposite conductivity type to said one conductivity type.

30. A double heterojunction field effect transistor according to claim 21 wherein said first single crystal semiconductor material is gallium arsenide and said spaced apart source and drain regions are of n-conductivity type, said second semiconductor material different from said first semiconductor material is gallium aluminum arsenide and said means for controlling is a gate layer of gallium arsenide heavily doped with silicon 31. A double heterojunction field effect transistor according to claim 21 wherein said first single crystal semiconductor material is indium arsenide and said spaced apart source and drain regions are of n-conductivity type doped with selenium or tellurium, said second semiconductor material different from said first semiconductor material is zinc telluride and said means for controlling is a gate layer of indium arsenide heavily doped with selenium or tellurium.

32. A double heterojunction field effect transistor according to claim 21 wherein said first single crystal semiconductor material is germanium and said spaced apart source and drain regions are of n-conductivity type doped with arsenic or antimony, said second semiconductor material different from said first semiconductor material is gallium aluminum arsenide and said means for controlling is a gate layer of germanium heavily doped with arsenic or antimony.

33. A double heterojunction field effect transistor according to claim 30 further including an ohmic contact of gold-germanium.

34. A double heterojunction field effect transistor according to claim 31 further including an ohmic contact of gold.

35. A double heterojunction field effect transistor according to claim 32 further including an ohmic contact of indium or tin.

36. A double heterojunction field effect transistor comprising:
   a first layer of a first single crystal semiconductor material having spaced apart source and drain regions of one conductivity type disposed therein defining a channel region therebetween,
   a barrier element of a second crystal semiconductor material different from said first semiconductor material disposed on said first layer over channel region and forming a heterojunction with said first layer, the band energy difference between said first layer and said barrier element providing a given barrier height, and
   means having the same potential as said source disposed on said barrier element for controlling at least the valence band edge of said first layer adjacent said heterojunction so it lies near the fermi level said means relative to said barrier element having a barrier height substantially equal to said given barrier height.

37. A double heterojunction field effect transistor according to claim 36 further including an ohmic contact connected to said means for controlling.

38. A double heterojunction field effect transistor according to claim 36 wherein said means for controlling at least the valence band edge of said first layer is a layer of single crystal semiconductor material heavily doped with a dopant of said one conductivity type.

39. A double heterojunction field effect transistor according to claim 36 wherein said means for controlling at least the valence band edge of said first layer is a layer of said first single crystal semiconductor material heavily doped with a dopant of said one conductivity type.

40. A double heterojunction field effect transistor according to claim 36 wherein said first semiconductor material is undoped and said regions of one conductivity type are p-conductivity type.

41. A double heterojunction field effect transistor according to claim 36 wherein said first semiconductor material is lightly doped with an n-conductivity type dopant and said regions of one conductivity type are p-conductivity type regions.

42. A double heterojunction field effect transistor according to claim 36 wherein at least a portion of said barrier element is made of doped single crystal semiconductor material.

43. A double heterojunction field effect transistor according to claim 36 wherein at least a portion of said barrier element is doped with a dopant of said one conductivity type.

44. A double heterojunction field effect transistor according to claim 36 wherein at least a portion of said barrier element is doped with a dopant of opposite conductivity type to said one conductivity type.

45. A double heterojunction field effect transistor according to claim 36 wherein said first single crystal semiconductor material is germanium and said spaced-apart source and drain regions are of p-conductivity type doped with gallium, said second semiconductor material different from said first semiconductor material is zinc selenide and said means for controlling is a gate layer of germanium heavily doped with gallium.

46. A double heterojunction field effect transistor according to claim 36 wherein said first single crystal semiconductor material is germanium and said spaced-apart source and drain regions are of p-conductivity type doped with gallium, said second semiconductor material different from said first semiconductor material is gallium aluminum arsenide and said means for controlling is a gate layer of germanium heavily doped with gallium.

47. A double heterojunction field effect transistor according to claim 45 further including an ohmic of indium or tin.

48. A double heterojunction field effect transistor according to claim 46 further including an ohmic contact of indium or tin.

* * * * *